(12) United States Patent
Iguchi et al.

(10) Patent No.: US 7,501,661 B2
(45) Date of Patent: Mar. 10, 2009

(54) RECEIVING OPTICAL SUBASSEMBLY WITH AN IMPROVED HIGH FREQUENCY PERFORMANCE

(75) Inventors: Satoshi Iguchi, Yokohama (JP); Yasushi Fujimura, Yokohama (JP); Hiroyuki Yabe, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 148 days.

(21) Appl. No.: 11/368,608

(22) Filed: Mar. 7, 2006

(65) Prior Publication Data

US 2006/0220038 A1    Oct. 5, 2006

Related U.S. Application Data

(60) Provisional application No. 60/659,180, filed on Mar. 8, 2005.

(51) Int. Cl.
*H01L 27/15* (2006.01)
(52) U.S. Cl. .................. 257/82; 257/E25.032
(58) Field of Classification Search .......... 257/82, 257/432–434
See application file for complete search history.

(56) References Cited

U.S. PATENT DOCUMENTS

| | | | |
|---|---|---|---|
| 5,610,395 A * | 3/1997 | Nishiyama | 250/239 |
| 6,213,650 B1 * | 4/2001 | Moriyama et al. | 385/88 |
| 6,374,021 B1 * | 4/2002 | Nakanishi et al. | 385/49 |
| 6,576,888 B2 * | 6/2003 | Fujimura et al. | 250/227.11 |
| 6,876,682 B2 * | 4/2005 | Nakabayashi et al. | 372/36 |
| 6,888,169 B2 * | 5/2005 | Malone et al. | 257/82 |
| 6,900,509 B2 * | 5/2005 | Gallup et al. | 257/414 |
| 6,900,512 B2 * | 5/2005 | Kohmoto et al. | 257/435 |
| 7,195,401 B2 * | 3/2007 | Moll et al. | 385/88 |
| 2001/0024551 A1 * | 9/2001 | Yonemura et al. | 385/88 |

FOREIGN PATENT DOCUMENTS

JP    07-312430 A    11/1995

* cited by examiner

*Primary Examiner*—Wai-Sing Louie
*Assistant Examiner*—Bilkis Jahan
(74) *Attorney, Agent, or Firm*—Michael A. Sartori; Steven J. Schwarz; Venable LLP

(57) ABSTRACT

The present invention provides a receiving optical subassembly (ROSA) with a co-axial shape and a stem for mounting semiconductor devices thereon that improves the high frequency performance of the ROSA. The ROSA mounts a photodiode (PD) and a pre-amplifier on a stem and the stem has a hollow the PD and the pre-amplifier are mounted therein. Since the hollow has a depth substantially equal to a thickness of the pre-amplifier, the bonding wire from the pre-amplifier to the surface of the stem may become shortest to reduce the parasitic inductance of the bonding wire and to enhance the high frequency performance of the ROSA.

6 Claims, 6 Drawing Sheets

RECEIVING OPTICAL SUBASSEMBLY WITH AN IMPROVED HIGH FREQUENCY PERFORMANCE

REFERENCE TO PRIORITY APPLICATION

This application claims benefit of provisional app. No. 60/659,180 filed Mar. 8, 2005.

BACKGROUND OF THE INVENTION

1. Filed of the Invention

The present invention relates to a receiving optical sub-assembly, in particular, the receiving optical sub-assembly having the so-called co-axial package.

2. Related Prior Arts

An optical sub-assembly installs a semiconductor optical device such as photodiode and laser diode therein and provides an optical aligning mechanism including a condenser lens, a sleeve, and so on to couple these devices to an optical fiber. The optical assembly whose transmission speed is below 2.5 GHz typically provides the co-axial package, except for special purpose assembly that builds in a temperature control function. Even the optical assembly for 10 Gbps transmission speed, which recently increases its reality, the package thereof usually applies the so-called butterfly package with an enough inner space for mounting the semiconductor devices and some electronic devices. However, to provide one solution for continuous request to make the assembly compact and low-cost, it has been investigated to apply the co-axial package for the optical sub-assembly used in the 10 Gbps transmission.

In the co-axial package, for instance, a transmitting optical sub-assembly (TOSA) mounts a laser diode (LD) on a metal stem via an insulating sub-mount, and electrically connects an electrode of the LD to a lead pin passing through the stem with a bonding-wire. To drive the LD, a modulation signal with a swing voltage about 1 V is necessary to drive the LD. While, the receiving optical sub-assembly (ROSA) directly outputs a photocurrent corresponding to an optical signal and generated by the PD, or outputs an electrical signal converted from the photocurrent and amplified by a pre-amplifier installed within the ROSA.

The Japanese Patent application published as JP-H07-312430A has disclosed one type of the ROSA which configures with the co-axial package and builds the PD and the pre-amplifier therein. On a center of the stem is mounted with a die capacitor and the PD is mounted on the upper electrode of this die capacitor. A signal from the PD is conducted to the pre-amplifier by the bonding wire directly connecting the PD with an input electrode of the pre-amplifier. The pre-amplifier is configured to convert the current signal into an electrical signal, to amplify thus converted electrical signal and to output the amplified signal from an output electrode thereof to the lead pin with a bonding wire. The output signal from this ROSA, whichever the current form and the voltage form, the magnitude thereof is far smaller than that of the TOSA, in the case of the voltage form, the magnitude of the signal output from the ROSA is generally smaller than 0.5 V.

It is quite hard to carry a signal, which is small enough in the magnitude thereof and as fast as 10 Gbps speed, on the load pin passing. Accordingly, the pre-amplifier is built within the sub-assembly to amplify the signal from the PD to output thus amplified signal, which is generally adopted in the optical assembly as shown in the Japanese Patent published as JP-H07-312430A. However, even the sub-assembly builds the pre-amplifier, a subject to satisfy the impedance matching condition for the lead pin is still left unsolved. Rather, because the sub-assembly builds the pre-amplifier in a limited space within the package, interconnections of the ground line and the power supply line brings difficulties, which causes peaks and dips in the frequency response, and occasionally the self oscillation of the sub-assembly.

A conventional sub-assembly with the co-axial package mounts the PD on the stem via the sub-mount, and installs the pre-amplifier just beside the PD. The ROSA is necessary at leas four lead pins, namely, the power supply ($V_{DD}$) for the pre-amplifier, the bias voltage for the ($V_{PD}$), the signal (Out), and the ground (GND). When the sub-assembly is requested to be operable for a high speed signal over 10 Gbps, another signal (/Out) complementary to the signal (Out) may be generally provided. In the conventional sub-assembly, four lead pins except for the ground are arranged on a circle and on the center of this circle, namely, the center of the stem, is arranged with the PD. The pre-amplifier is placed between two lead pins and just beside the PD. The ground pin (GND) is in directly contact to the stem in the back surface thereof.

FIG. 9 shows an arrangement of devices mounted on the conventional stem. This stem, typically made of iron or Kovar, has a disk shape with a diameter from about 3 mm to 6 mm and a thickness of about 1.0 mm. On a center thereof is mounted with the PD with a thickness thereof about 0.2 mm via the die capacitor. A light incident surface of the PD directs the normal of the stem. That is, although not shown in FIG. 9, the sub-assembly provides a lens above the stem, namely, a direction extending the normal of the stem. Optically alignment members are arranged so as to position the optical fiber in an opposite side of the stem with respect to this lens. Thus, the light emitted from the end of the optical fiber enters the incident surface of the PD through the lens.

The pre-amplifier is arranged in just beside the PD, in FIG. 9, between two lead pins beside the PD. Electrodes of the pre-amplifier are arranged in a line along both sides opposite to each other, one of which within one line is the electrodes for the signal (Out), and another electrode within the other line corresponds to the complementary signal (/Out). The power supply $V_{CC}$ for the pre-amplifier is supplied to the electrode on the pre-amplifier via another die-capacitor difference from that mounting the PD. The ground of the pre-amplifier is secured by wire-bonding the electrodes arranged along respective sides directly to the surface of the stem.

In the arrangement shown in FIG. 9, although the ground of the pre-amplifier may be secured by bonding the ground electrodes thereof directorily to the surface of the stem, a length of the bonding-wire is unavoidable to be lengthend by a length corresponding to a thickness of the pre-amplfier wire-bonded wherever the surface of the stem. When the assembly operates in 10 GHz range, the characteristic length sometimes shorter than 1 mm. While, the thickness of the pre-amplifier is generally about 0.1 mm to 0.5 mm, accordingly, the length corresponding to the thickness of the pre-amplifier reflects in the high frequency performance of the pre-amplifier in the 10 Gbps range.

SUMMARY OF THE INVENTION

In order to solve subjects above mentioned; an optical assembly according to the present invention has a feature that the assembly comprises a stem that includes a mounting region and a bonding region. The former region mounts the semiconductor optical device and the pre-amplifier, while the latter region is wire-bonded by the pre-amplifier, and according to the present invention, the mounting region is formed lower with respect to the bonding region. The mounting region may form a hollow, or the bonding region may form a terrace.

By mounting the pre-amplifier in the mounting region, the ground electrodes of the pre-amplifier can be wire-bonded to the bonding region with a shortest length. Accordingly, the parasitic inductance inherently attributed to the bonding-wire with a fine diameter may be reduced to stable the ground potential for the pre-amplifier, and may prevent the high frequency performance over 10 GHz of the optical assembly from degrading.

The hollow in the mounting region or the terrace in the bonding region may have a depth for the hollow or a height for the terrace substantially equivalent to a level of the top surface of the pre-amplifier. According to such arrangement of the hollow or the terrace, the length of the bonding-wire connecting to ground electrodes of the pre-amplifier to the bonding region can be shortest.

DESCRIPTION OF PREFERRED EMBODIMENTS

First Embodiment

Figure 1:
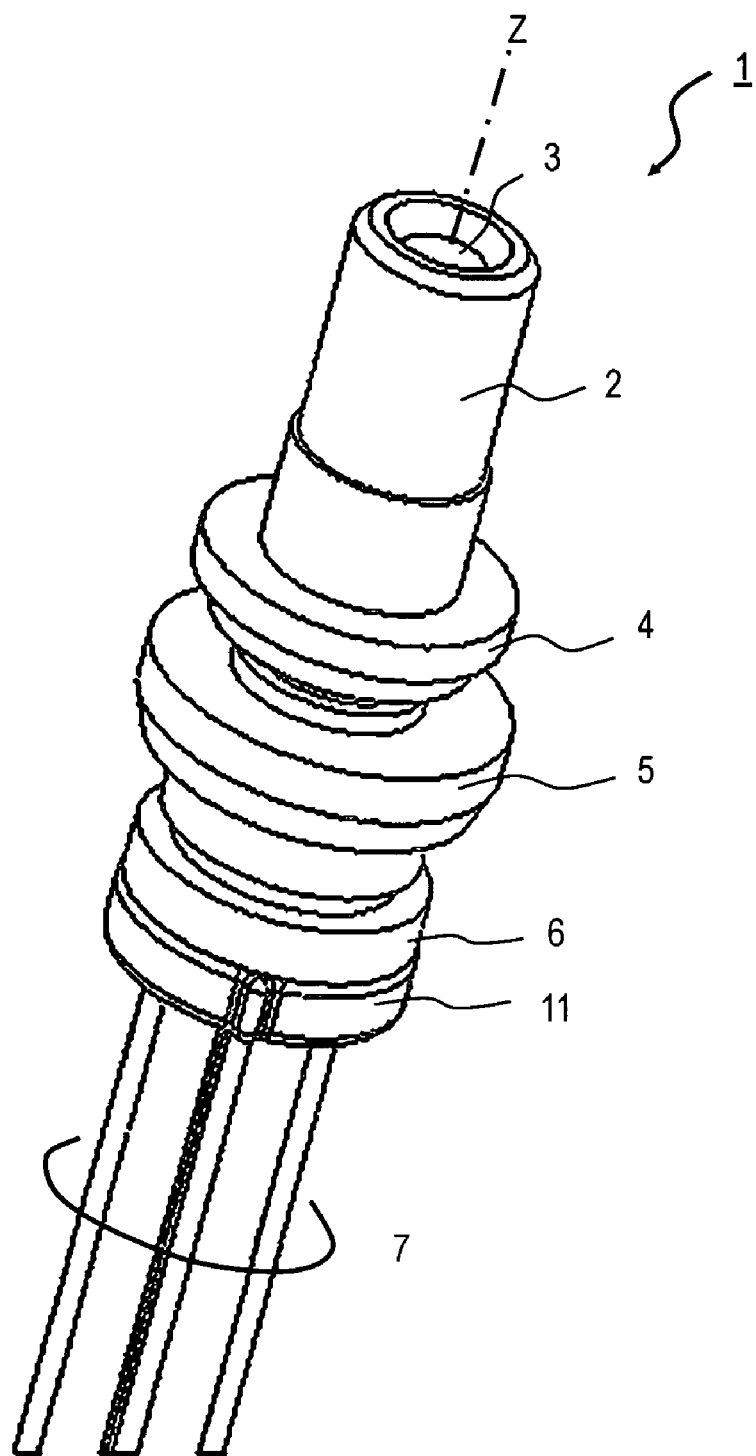
FIG. 1 is a perspective view of a receiving optical subassembly according to the present invention.

FIG. 1 is a perspective view of a receiving optical subassembly (ROSA) according to the present invention. The ROSA 1 includes a sleeve 2, a joint-sleeve 5, a lens cap 6, and a stem 11, all of which have a cylindrical shape. The sleeve 2 forms a receptacle 3 in a tip end thereof to receive a ferrule attached to a tip end of an optical fiber. The outer diameter of the ferrule substantially coincides with the inner diameter of the receptacle. Accordingly, the optical fiber inserted into the receptacle may couple with a light-receiving device such as photodiode (PD) mounted on the stem 11. On the outer surface of the sleeve 2 is formed with a flange 4 to determine the position of the ROSA within a device such as optical transceiver.

A root of the sleeve 2 positions a joint sleeve (J-sleeve) 5. The J-sleeve 5 optically aligns the sleeve 2 with a portion including the stem 11 where the semiconductor optical device is mounted. That is, the end of the J-sleeve 5 has a flat surface perpendicular to an optical axis Z, while, an end of the sleeve 2 has a flat surface. By sliding the sleeve 2 on the end surface of the J-sleeve 4, the sleeve can be aligned in optical with respect to directions perpendicular to the optical axis Z. Moreover, in the root of the J-sleeve 5, the side where the device is mounted, is provided with a skirt so as to cover the lens cap 6. Within the bore of this skirt inserting the lens cap 6, and by adjusting the depth of the insertion of the lens cap 6, the optical alignment between the sleeve 2 and the optical device may be performed along the optical axis Z.

The lens cap 6 has a lens on the top thereof, and forms a cavity, co-operated with the stem 11, into which the optical device such as PD is installed. The lens cap 6 is made of metal, and the stem is also made of metal. By performing the resistance welding between the lens cap 6 and the stem 11, this cavity is air-tightly sealed.

The assembly of this ROSA 1 is as follows: (1) first, semiconductor devices such as PD and pre-amplifier are mounted on the stem 11 and air-tightly seals these devices co-operated with the lens cap to form an optical receiving device; (2) next, the J-sleeve 5 and the sleeve 2 are attached with this optical receiving device as aligning them in optical. That is, inserting the ferrule into the receptacle 3 with the optical fiber and guiding light into this optical fiber, the PD on the stem 11 practically receives the light emitted from the tip of the optical fiber such that the output from the PD exceeds a preset value by adjusting the insertion depth of the lens cap 6 into the skirt of the J-sleeve 5 and sliding the sleeve 2 on the end surface of the J-sleeve 5; (3) finally, after obtaining the preset sensitivity, the lens cap 6, the J-sleeve 5, and the sleeve 2 are welded by the YAG laser. Fixing between the lens cap 6 and the J-sleeve 5 may be carried out by an adhesive.

Next, the stem 11 and an arrangement of semiconductor devices on the stem 11 will be described.

Figure 2:
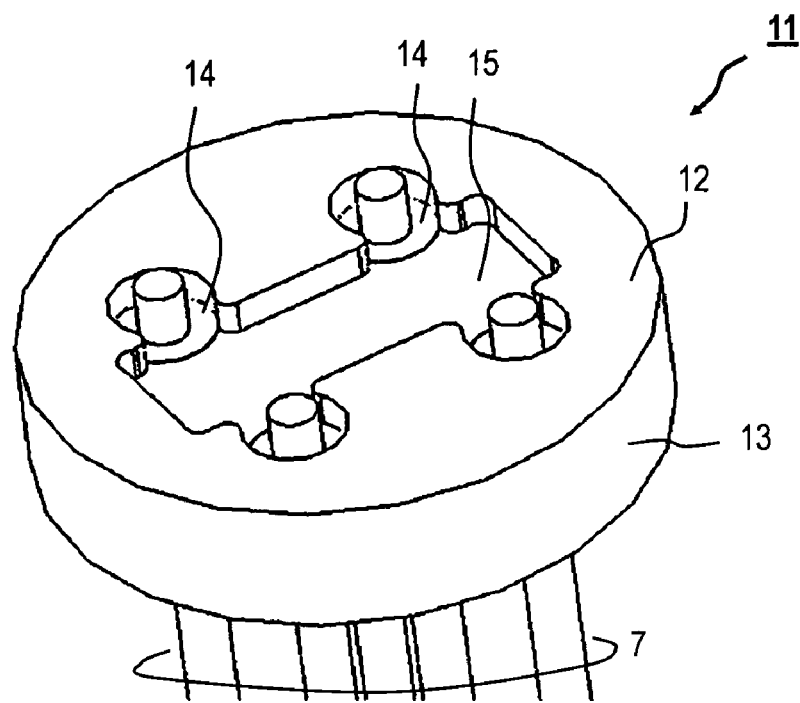
FIG. 2 is a perspective view of a stem according to the first embodiment of the present invention.

FIG. 2 is a perspective view of the stem 11 according to the present invention. The stem 11 is made of metal such as iron (Fe), Kovar, and SPC with coating its surface with gold (Au) formed by extruding. The diameter thereof, although depending on the specification of the ROSA 1, is generally from 3 mm to 6 mm, and the thickness of the metal plate is 0.5 mm to 2.0 mm. A plurality of lead pins 7, similar to the conventional arrangement of the ROSA, is provided. The present stem 11 have five pins each for $V_{DD}$, $V_{PD}$, Out, /Out and ground (GND), the former four pins pass through the stem 11 and extrude from a primary surface 12 thereof. Between these four lead pins 7 and the stem 11 are filled with a sealing glass 14 to isolate pins 7 in electrical from the stem 11. FIG. 2 views the primary surface 12 of the stem 11, which provides a function of a bonding region. The back surface arranges in a dished shape. That is, the side 13 of the stem 11 rims so as to fill the sealing glass 14 within a portion surrounded by the side. The ground pin is directly attached to the back of the primary surface 12 of the stem without passing through the stem 11. Accordingly, the stem 11 is electrically grounded. The other four pins are positioned in a circle with a center thereon coinciding with the ground pin.

The stem 11 of the present embodiment forms a hollow 15 in a portion surrounded by four lead pins. The hollow 15 provides a function of a mounting region. The depth of the hollow 15 may be from 200 μm to 400 μm, which is substantially equal to the thickness of the pre-amplifier mounted in the subsequent process. When the stem 11 is formed by the extruding, it may be quite easy to form the hollow 15 by forming a projection in a die for the extruding. In FIG. 2, the sealing glass 14 surrounding the lead pins 7 is filled to the bottom of the hollow 15. However, it may be applicable for the sealing glass 14 to fill to the primary surface 12, except for the bottom of the hollow 15, of the stem 11.

Figure 3:
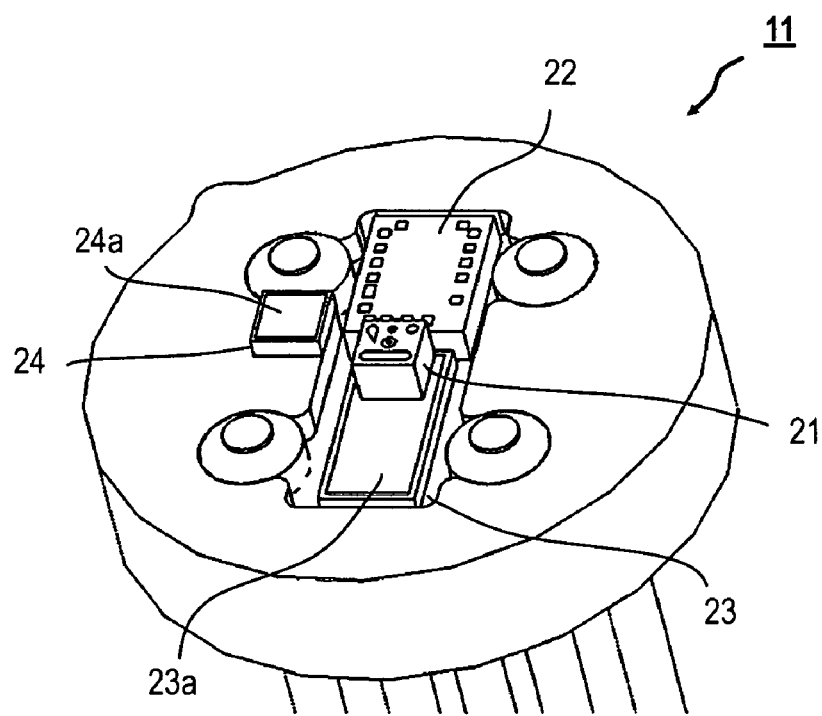
FIG. 3 is a perspective view of the stem mounting first and second die capacitors, the PD, and the pre-amplifier thereon.

FIG. 3 shows the stem 11 with the pre-amplifier 22, the PD 21, and the first die capacitor 23 mounted within the bottom of the hollow 15. The first die capacitor 23 is mounted on nearly half of the hollow 15 including a center portion thereof. This die capacitor 23, a thickness of which is about 0.2 mm and made of dielectric material with electrodes in both surfaces thereof, has about 160 pF. Since this die capacitor 23 is mounted directly onto the primary surface 12 of the stem 11, one electrode thereof is grounded, while the other electrode 23a is wire-bonded to one of lead pins, 7b, and to one electrode of the PD 21. It is preferable to bond a plurality of wires to reduce the parasitic inductance thereof.

On the upper electrode 23a of the first die capacitor 23 is mounted with the PD 21. In FIG. 3, this PD 21 has semiconductor layers such as contact layer and an active layer on a semi-insulating semiconductor substrate. Therefore, these layers are electrically isolated from the upper electrode 23a of the first die capacitor 23 by the substrate thereof. On the top surface of the PD 21 is formed with two electrodes, the anode and the cathode, one of which is wire-bonded to the upper electrode 23a of the die capacitor 23, while the other is wire-bonded to an input electrode of the pre-amplifier 22 without relaying any post. A signal line, namely the bonding wire, between the input electrode of the pre-amplifier 22 and the PD 21 is the most sensitive to the noise characteristic of the ROSA 1. To wire-bond the PD 21 in direct to the input electrode of the preamplifier 22 may escape the signal line from the parasitic capacitance thereof and only the residual inductance due to the bonding wire affects the high frequency performance of the ROSA 1.

In the stem 11 shown in FIG. 3, a level of the top surface of the PD 21, a height measured from the primary surface of the stem 12, is difference from a level of the top surface of the pre-amplifier 22. This is due to the thickness of the PD 21. That is, the PD typically has a thickness greater than 0.1 mm. Accordingly, the top level of the PD 21 is higher than that of the pre-amplifier 22 when the PD 21 is mounted on the die capacitor 23. It may be applicable, in order to prevent this discrepancy on the top level between two devices, to form the hollow 15 with two portions. The bottom of the hollow 15 in a portion where the die capacitor 23 is mounted arranges in deep by about 0.1 mm to 0.2 mm compared to the other bottom portion where the pre-amplifier 22 is mounted. Thus, the top levels of two devices, the PD 21 and the pre-amplifier 23, can be equalized.

Moreover, the PD 21 shown in FIG. 3 has a type having the semi-insulating substrate. However, it may be applicable for the PD 21 to have a conductive substrate. In such case, one electrode of the PD 21 is provided in the top surface thereof, while the other electrode is formed in the back surface. Accordingly, it may be unnecessary to wire-bond the upper electrode 23a of the die capacitor 23 to the PD 21. To mount the PD 21 on the upper electrode 23a of the die capacitor 23 can be equivalent to connect in electrical the one electrode of the PD 21 to the lead pin 7b.

The power supply $V_{DD}$ for the pre-amplifier 22 is provided from the lead pin 7a via the second die capacitor 24. This second die capacitor 24 is mounted just beside the pre-amplifier 22. The lead pin 7a is wire-bonded to the upper electrode 24a of this die capacitor 24, and the upper electrode 24a of the die capacitor 24 is wire-bonded to the pre-amplifier 22. It is desirable for this second die-capacitor 24 to have large capacitance as long as the mounting space has a room. The capacitance of the die capacitor 24 shown in FIG. 3 is 330 pF. Moreover, it is preferable for the bonding wire from the lead pin 7a to the die capacitor 24 to be as many as possible to reduce the parasitic inductance due to the bonding wire. Similarly, the count of the bonding wire from the die capacitor 24 to the pre-amplifier 22 may be as many as possible.

The output from the pre-amplifier 22 is brought from electrodes arrange along sides of the pre-amplifier 22 opposite to each other to corresponding lead pins, 7c and 7d. By leveling the tip end of the lead pins, 7c and 7d, with the top surface of the pre-amplifier 22, the length of the bonding wire from the electrode of the pre-amplifier to the lead pins, 7c and 7d, can be shortest. In the conventional ROSA, the sealing mechanism of the lead pin to the stem made it hard to level the tip of the lead pin coinciding with the primary surface 12 of the stem 11, because the lead pin does not extrude from the primary surface 12 when two levels are equalized.

On the other hand, in the present stem 11, a peripheral of the lead pin becomes a portion of the hollow 15, thus the lead pin 7 may extrude from the bottom of the hollow 15 and the tip of the lead pin may level with the primary surface 12 of the stem 11 and with the top surface of the pre-amplifier 22.

The ground electrodes of the pre-amplifier 22 are arranged in dispersive along respective sides of the pre-amplifier 22. Moreover, by wire-bonding each ground electrode to a position on the primary surface 12 except for the hollow 15 just beside thereof, the ground potential for the pre-amplifier 22 may be stabilized as a length of the bonding-wire keeps shortest. Devices mounted on the stem 11, in particular the mounting position thereof, makes it impossible to wire-bond the ground electrode of the pre-amplifier 22 to a position just beside thereof. Even in such case, since the ground electrodes are arranged in dispersive along all sides of the pre-amplifier 22, the other ground electrode can be wire-bonded to the position just beside thereof. Thus, the high frequency performance of the ROSA can be stabilized.

Figure 4:
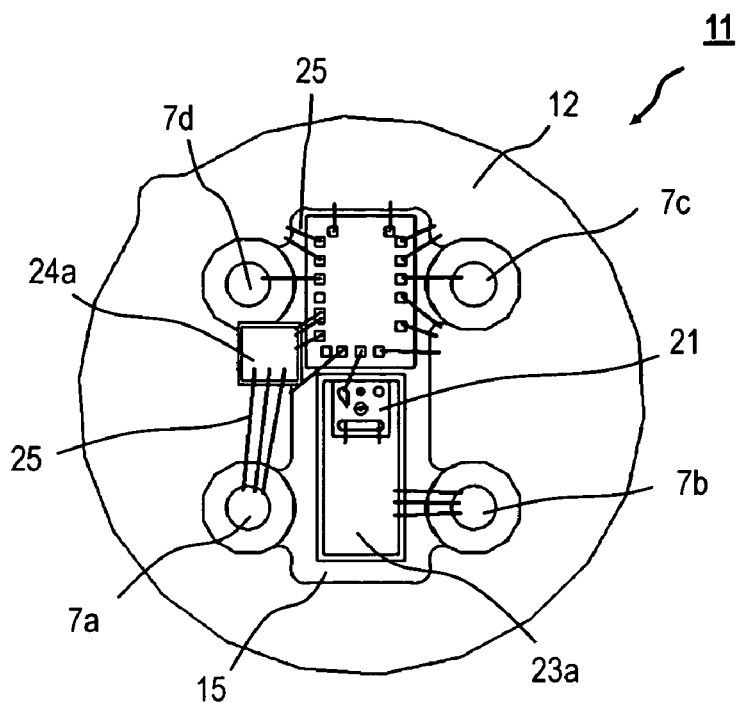
FIG. 4 is a plan view of the stem mounting devices and wire-bonding these devices to lead pins and to the primary surface of the stem.
Figure 5:
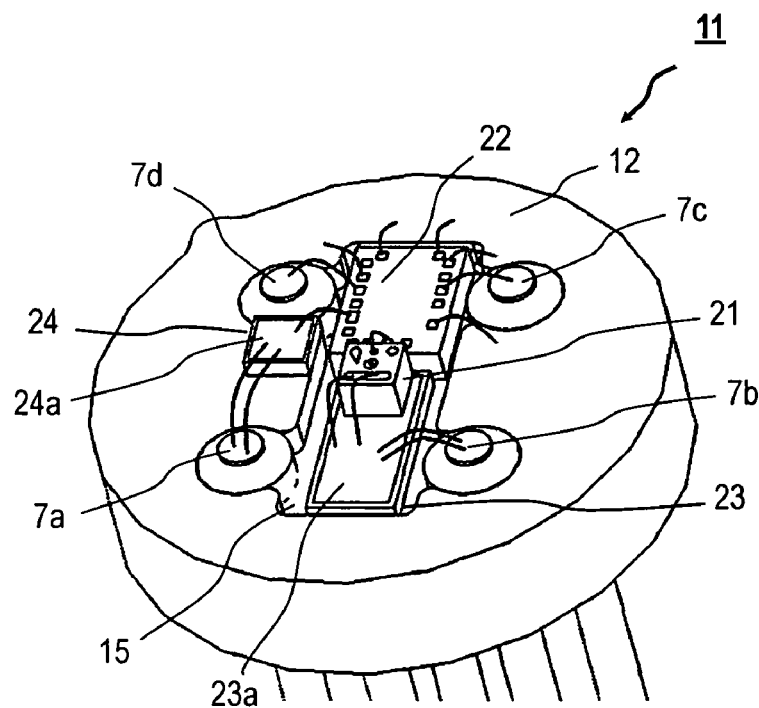
FIG. 5 is a perspective view of the stem with devices wire-bonded therebetween, to the lead pin, and to the surface of the stem, which is shown in FIG. 5.

FIG. 4 is a plan view of the stem 11 with devices, the first and second die capacitors, 23 and 24, the PD 21, and the pre-amplifier 22, mounted thereon and wire-bonded to respective lead pins 7 and the primary surface 12 thereof, and FIG. 5 is a perspective view of the stem 11 in the same arrangement.

The upper electrode 23a of the first die capacitor 23 is wire-bonded to one of lead pins 7b, which supplies the bias voltage $V_{PD}$ for the PD 21, and also wire-bonded to the one electrode of the PD 21 with a plural bonding-wire 25. Thus, the bias voltage $V_{PD}$ may be supplied to the PD 21 laying the die capacitor 23 as a bypass capacitor. The lead pin 7a, which supplies the power supply voltage $V_{cc}$, is wire-bonded to the upper electrode 24a of the second die capacitor 24 with a plural bonding-wire 25. Also, this upper electrode 24a is wire-bonded to the electrodes of the pre-amplifier 22 with a plural bonding-wire 25. Thus, the power supply $V_{cc}$ may be supplied to the pre-amplifier 22 laying the second die capacitor 24 as a bypass capacitor. Moreover, the other electrode of the PD 21 is wire-bonded directly, without laying any post, to the input electrode of the preamplifier 22 with single bonding-wire 25. Accordingly, a faint electrical signal corresponding to the optical signal received by the PD 22 can be transmitted to the pre-amplifier 22 without degrading the frequency response and the noise tolerance. Moreover, the output signals, Out and /Out, compensating to each other are pulled out from output pads formed in opposing sides of the pre-amplifier 22 to the corresponding lead pins, 7c and 7d, with single bonding-wire 25. Ground electrodes formed in dispersive in four sides of the pre-amplifier 22 are wire-bonded to the primary surface 12 of the step just beside each ground electrode with plural bonding wires 25 in the shortest configuration.

Figure 6:
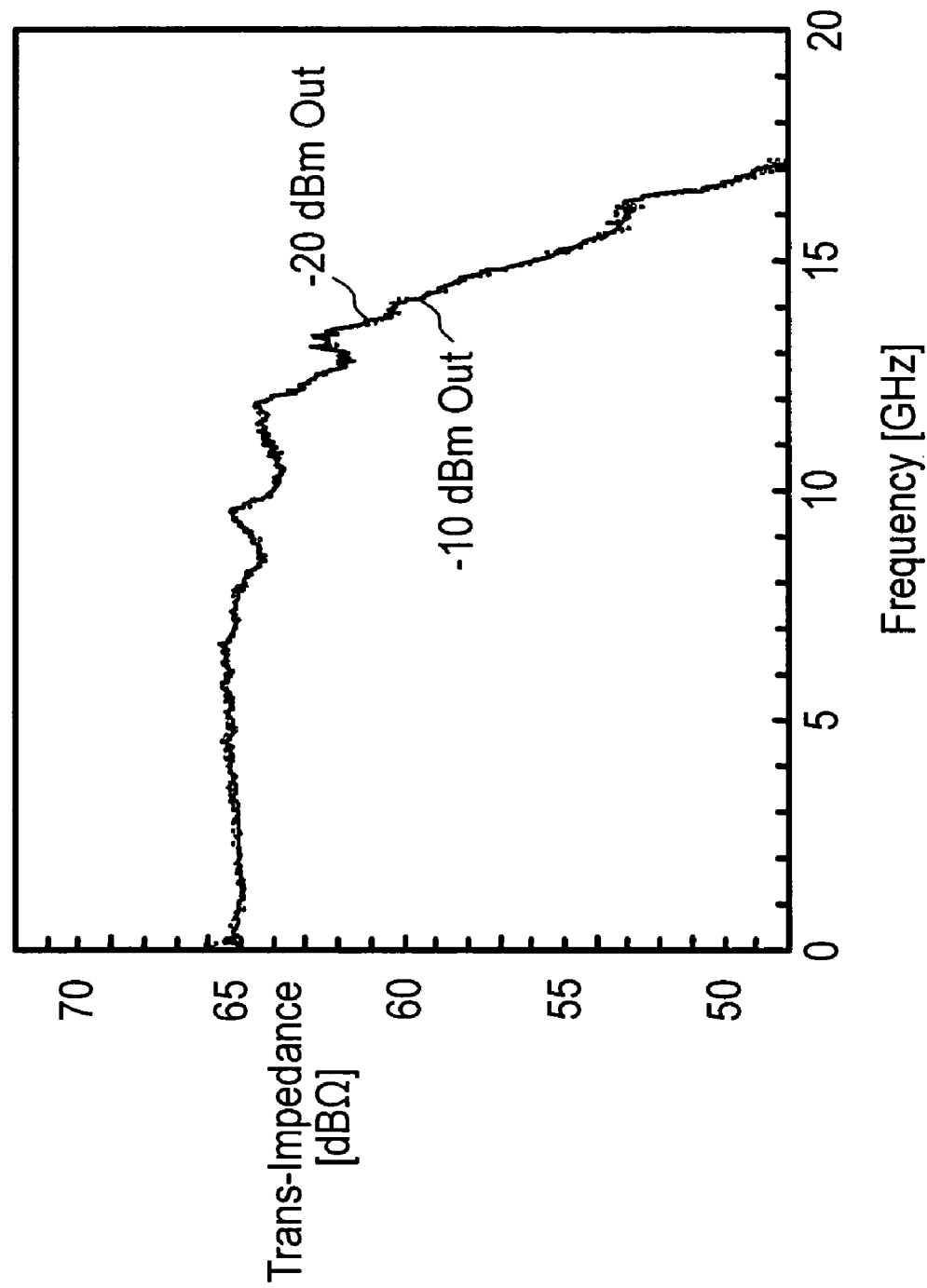
FIG. 6 is a frequency response in the trans-impedance of the present receiving optical subassembly.
Figure 7:
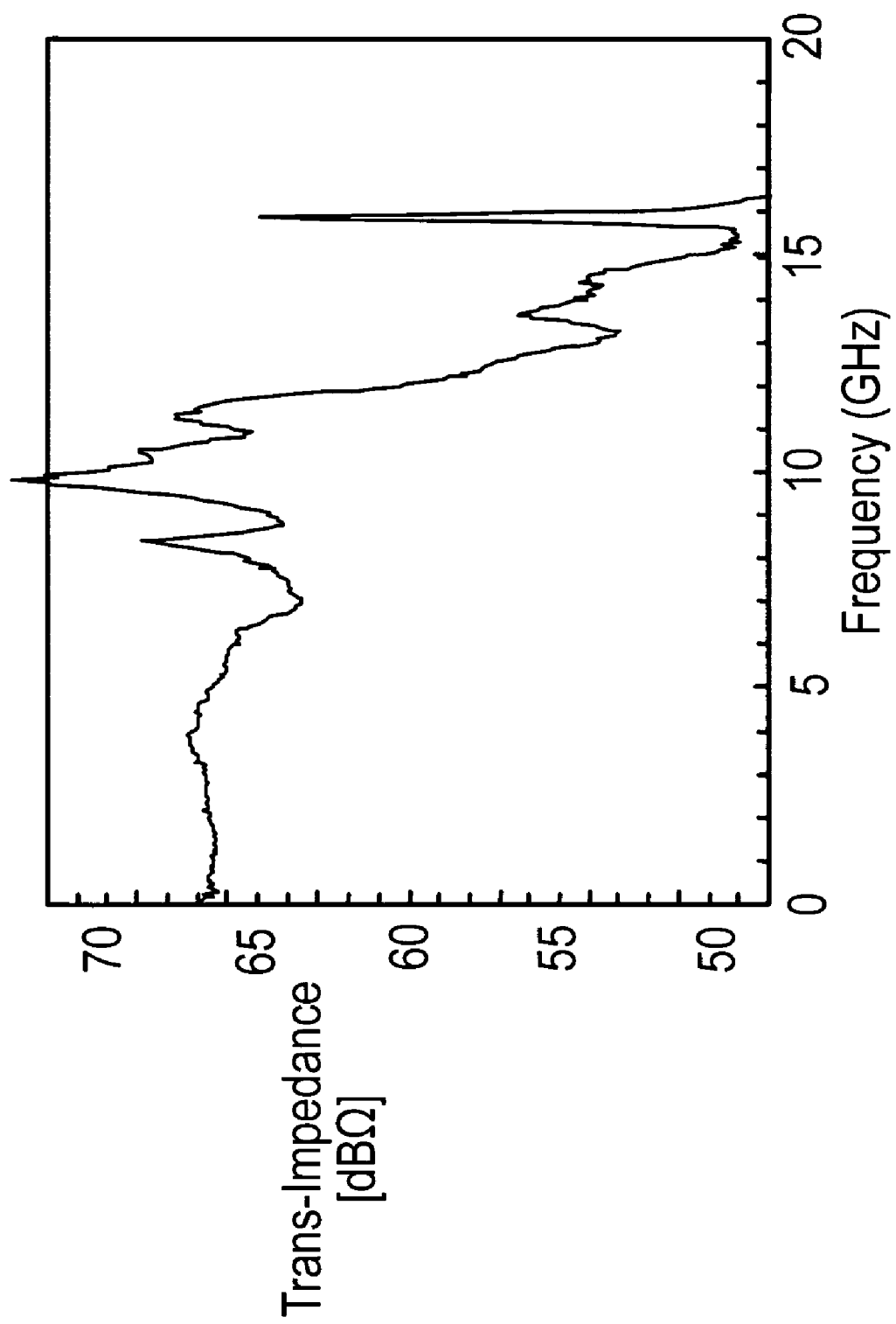
FIG. 7 is a frequency response in the trans-impedance of the conventional module.

FIG. 6 and FIG. 7 compare the frequency response of the ROSA according to the present invention (FIG. 6) with the conventional one (FIG. 7). The frequency responses are so measure that an optical signal varied with frequencies enters the PD 21 and the output, Out or /Out, of the pre-amplifier 22 is scanned with frequencies of the input optical signal. The optical signal has two levels; one is −10 dBm while the other is −20 dBm. Moreover, in FIGS. 6 and 7, the vertical axis corresponds to the trans-impedance, namely, the figures show the frequency response of the trans-impedance. This is derived by the following equation assuming the optical-to-electrical conversion efficiency $\epsilon$ [A/W] is fixed to a constant:

$$Z = V_{OUT}/(\epsilon * P),$$

where P is an optical input power. Accordingly, the frequency response of the trans-impedance corresponds to the frequency response of the ROSA 1.

Comparing FIG. 6 with FIG. 7, the conventional assembly shown in FIG. 7 shows a widely scattered response in the trans-impedance when the frequency exceeds 5 GHz. In particular, large peaks are recognized at 10 GHz and 16 GHz, which suggests that the assembly self-oscillates at these frequencies. On the other hand in the present ROSA, the response of the trans-impedance shows quite stable even when the frequency exceeds 10 GHz, and the gain ripple is within 3 dBΩ at most, and the bandwidth thereof, −3 dB bandwidth which is defined that the response decreases by 3 dB with respect to that of low frequencies, extends to 12.6 GHz enough for the ROSA to be applicable in 10 Gbps transmission speed.

Second Embodiment

Figure 8:
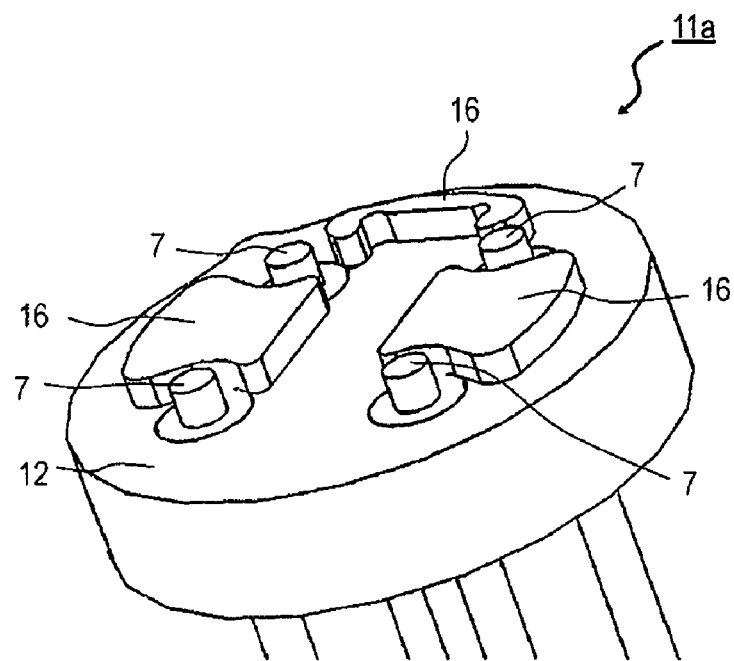
FIG. 8 is a perspective view of the stem according to the second embodiment of the invention.
Figure 9:
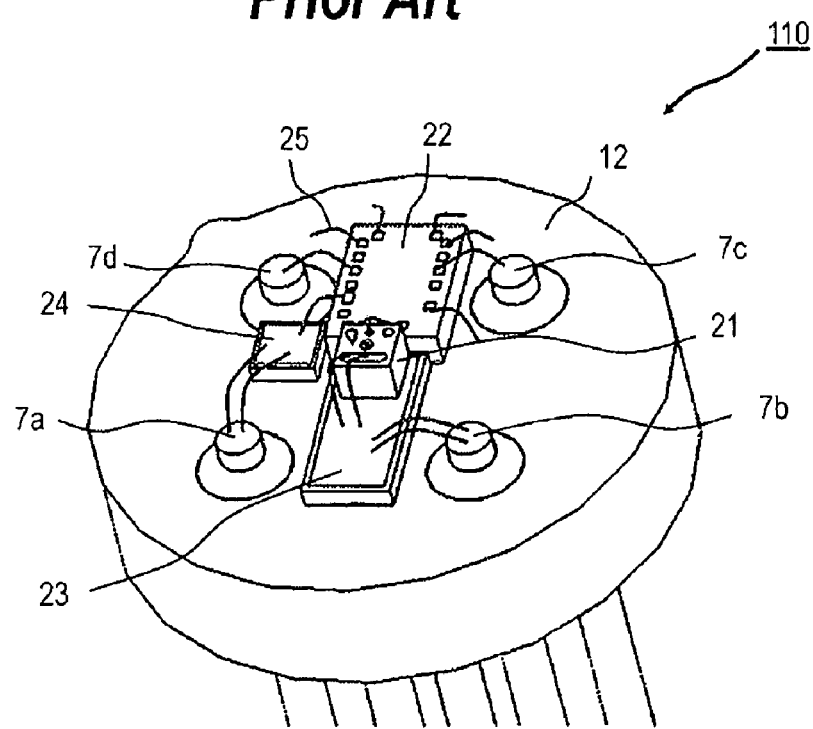
FIG. 9 is a perspective view of the conventional stem with devices wire-bonded to the lead pin and to the surface of the stem.

FIG. 8 is a perspective view of a stem 11a according to the second embodiment of the invention. The stem 11 of the first embodiment has the hollow 15 in a center thereof within which the pre-amplifier 22 and other devices are mounted. On the other hand, the stem 11a of the present embodiment provides terraces 16 around a center portion of the stem 11a, which equivalently makes the center portion of the stem hollow. These terraces are, same as the hollow 15 in the first stem 11, easily formed by the extruding. The height of the terrace 16 may be set from 200 μm to 400 μm, similar to the depth of the hollow 15. The present stem 11a also enables to stabilize the high frequency performance of the ROSA 1.

As one modification, the hollow 15 in the first embodiment and the terrace 16 in the second embodiment may be combined. In the description for the first embodiment, the depth of the hollow 15 may be distinguished between a portion where the pre-amplifier 22 is mounted and a portion the PD 21 is installed. The combination of the hollow 15 and the terrace 16 reflects these complex depths in the hollow 15. That is, the hollow 15 is formed in the portion the PD is installed, while the terrace 16 is formed to surround the portion the pre-amplifier 22 is mounted. This combined configuration enables to reduce the depth of the hollow 15 and the height of the terrace 16, the extruding of the stem may be simplified and the reliability thereof may be enhanced in the mechanical viewpoint.

In the foregoing description, the disclosed structures have been described with reference to exemplary embodiments. It will, however, be evident that various modifications and changes may be made thereto without departing from the spirit and scope of this disclosure. For example, although the embodiments described concentrates on the ROSA, the present configuration of the stem may be applicable for a transmitting optical sub-assembly (TOSA), in particular, when the light-emitting device is a type of a vertical cavity surface emitting laser diode (VCSEL), the present stem is effectively applied. The above specification and figures accordingly are to be regarded as illustrative rather than restrictive. It is therefore intended that the present disclosure be unrestricted by the foregoing description and drawings, except as may appear in the following appended claims.

What is claimed is:

1. An optical assembly, comprising:
   a semiconductor light-receiving device, by receiving an optical signal, for generating an electrical signal corresponding to the optical signal;
   a pre-amplifier electrically connected to the semiconductor light-receiving device for amplifying the electrical signal; and
   a metal stem including a mounting region and a bonding region, the mounting region mounting the semiconductor light-receiving device and the pre-amplifier thereon, the pre-amplifier being grounded to the bonding region, the mounting region and the bonding region forming a unified body,
   wherein the bonding region forms a terrace with a height substantially equal to a thickness of the pre-amplifier such that a top surface of the pre-amplifier levels with respect to the top surface of the bonding region.

2. The optical assembly according to claim 1,
   wherein the pre-amplifier provides a plurality of ground electrodes wire-bonded to the bonding region.

3. The optical assembly according to claim 1,
   further including a die capacitor mounted in the mounting region,
   wherein the semiconductor light-receiving device is mounted on the die capacitor such that the semiconductor light-receiving device positions substantially in a center portion of the stem.

4. The optical assembly according to claim 1,
   further including a die capacitor,
   wherein the mounting region includes first and second portions, the first portion forming a hollow where the semiconductor light-receiving device is mounted thereon via the die capacitor, the pre-amplifier being mounted on the second region, the bounding region around the second portion forming the terrace.

5. The optical assembly according to claim 1,
   further comprising a plurality of lead pins in the bonding region, the lead pins being electrically isolated from the stem.

6. The optical assembly according to claim 1,
   wherein the terrace in the bonding region is formed by the extruding.

* * * * *